United States Patent
Chao (10) Patent No.: US 12,273,121 B2
(45) Date of Patent: Apr. 8, 2025

(54) APPARATUS AND METHOD OF REFERENCE-FREE SAR ANALOG-TO-DIGITAL CONVERSION

(71) Applicant: Yuan-Ju Chao, Cupertino, CA (US)

(72) Inventor: Yuan-Ju Chao, Cupertino, CA (US)

(73) Assignee: IPSmart Inc., Hsinchu (TW)

( * ) Notice: Subject to any disclaimer, the term of this patent is extended or adjusted under 35 U.S.C. 154(b) by 243 days.

(21) Appl. No.: 17/971,801

(22) Filed: Oct. 24, 2022

(65) Prior Publication Data

US 2024/0137036 A1 Apr. 25, 2024
US 2024/0235570 A9 Jul. 11, 2024

(51) Int. Cl.
| | |
|---|---|
| *H03M 1/12* | (2006.01) |
| *H03M 1/06* | (2006.01) |
| *H03M 1/38* | (2006.01) |
| *H03M 1/46* | (2006.01) |

(52) U.S. Cl.
CPC ........ *H03M 1/1245* (2013.01); *H03M 1/0607* (2013.01); *H03M 1/38* (2013.01); *H03M 1/462* (2013.01)

(58) Field of Classification Search
CPC .. H03M 1/1245; H03M 1/0607; H03M 1/462; H03M 1/38
See application file for complete search history.

(56) References Cited

U.S. PATENT DOCUMENTS 11,133,812 B1 * 9/2021 Lebedev ................. H03M 1/40

* cited by examiner

*Primary Examiner* — Joseph J Lauture
(74) *Attorney, Agent, or Firm* — PatentPC; Bao Tran (57) ABSTRACT

A method of eliminating reference voltage of Analog-to-Digital Converter to enhance faster conversion rate, achieve compact size and decrease power consumption for Successive Approximation Register (SAR) Analog-to-Digital Converter (ADC).

16 Claims, 9 Drawing Sheets

APPARATUS AND METHOD OF REFERENCE-FREE SAR ANALOG-TO-DIGITAL CONVERSION

BACKGROUND

Figure 1:
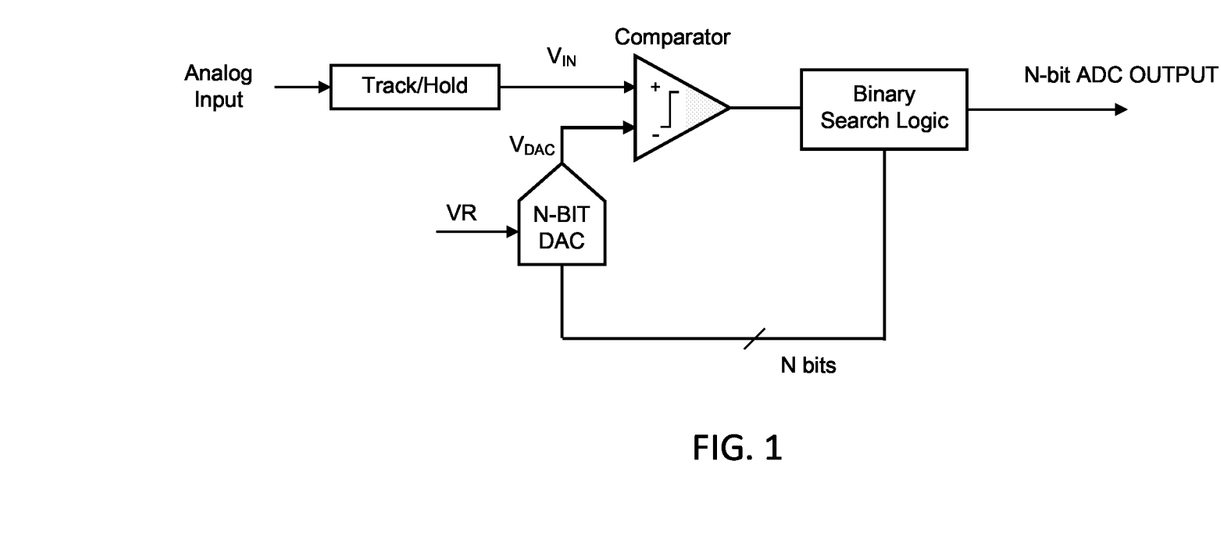
FIG. 1 illustrates the block diagram of conventional N-bit SAR ADC.

FIG. 1 illustrates the block diagram of conventional N-bit Successive Approximation Register Analog-Digital Converter (SAR ADC) comprising Track/Hold, Comparator, N-bit DAC and Binary Search Logic. The analog input voltage $V_{IN}$ is sampled and held by Track/Hold. N-bit DAC is initially set to midscale (100 . . . 00) which forces the DAC output $V_{DAC}$ to be VR/2, where VR is the reference voltage of ADC. The Comparator compares $V_{IN}$ and $V_{DAC}$ and determines the next operation based on the comparator result. If $V_{IN}$ is greater than $V_{DAC}$, the comparator output is logic high and the most significant bit (MSB) of N-bit register remains at 1. Conversely, if $V_{IN}$ is less than $V_{DAC}$, the comparator output is logic low and the MSB is cleared to logic 0. This binary-search process proceeds to the next lower bit and the conversion is completed once the least significant bit (LSB) output is obtained.

Figure 2:
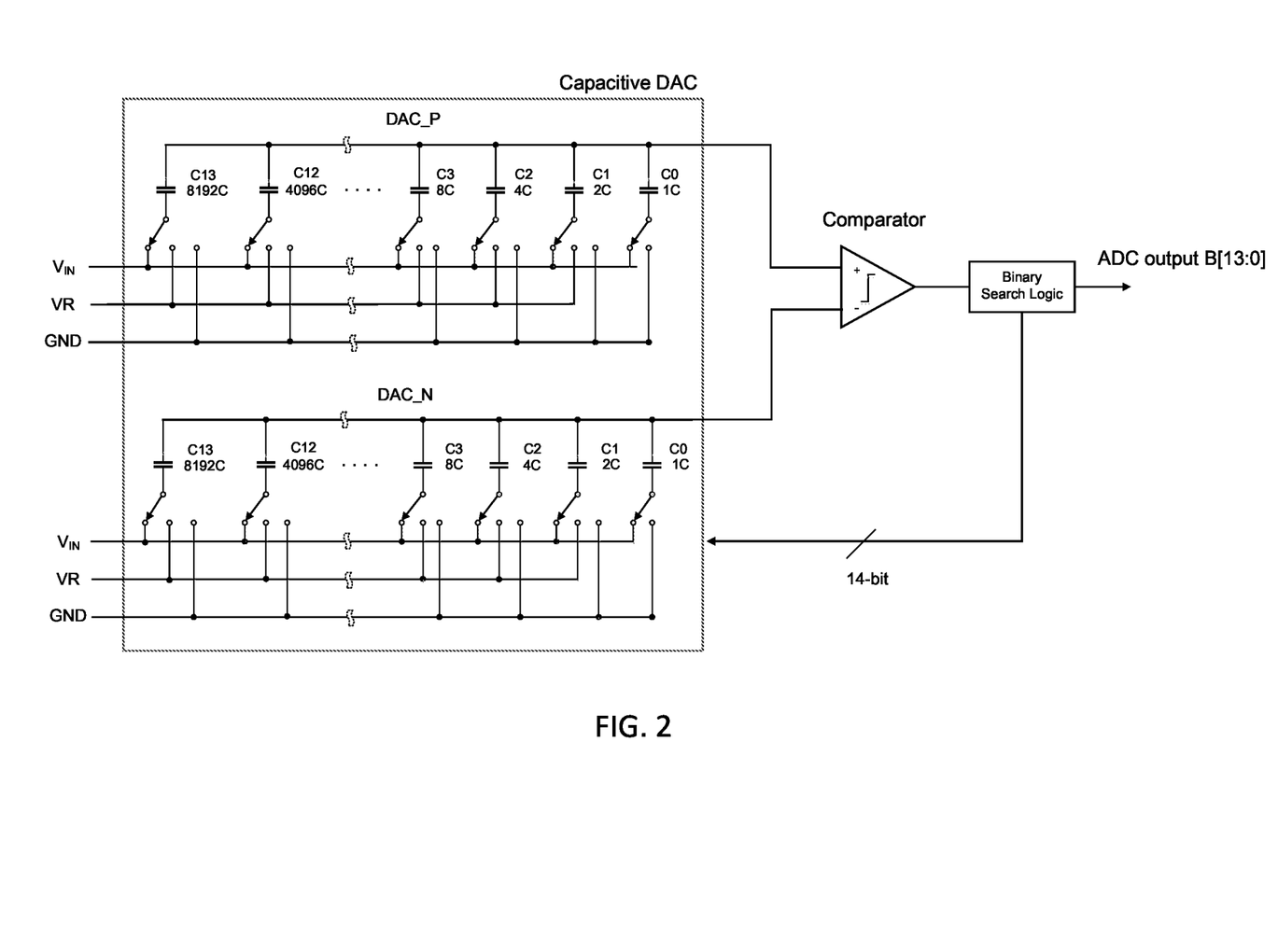
FIG. 2 is the implementation of 14-bit SAR ADC using 14-bit binary capacitive DAC.

Both Track/Hold and DAC functions can be fulfilled using capacitive DAC owing to its inherent track/hold function. A capacitive DAC consists of an array of capacitors with binary weighted values. It employs the principle of charge redistribution to generate an analog output voltage during the binary search process. FIG. 2 shows the exemplary implementation of 14-bit SARADC using 14-bit binary weighted capacitive DAC. Each capacitor can be connected to input $V_{IN}$, reference voltage VR or ground. During the sample phase, all the switches are connected to the input $V_{IN}$. $V_{IN}$ voltage is effectively sampled and stored on the capacitors. As the first step of binary-search process begins, the bottom plate of MSB capacitor is connected to reference voltage VR. This drives the voltage of comparator inputs by an amount of OMR. The comparator strobes and the comparator output value is generated. As the binary-search process continues, the next smaller capacitor is connected to VR. The conversion process is complete once all the DAC capacitors are exercised. The relationship of $V_{IN}$, VR and SAR ADC digital output is expressed by the equation Eq(1):

$$V_{IN} = B13 * \frac{VR}{2} + B12 * \frac{VR}{4} + \ldots + B1 * \frac{VR}{8192} + B0 * \frac{VR}{16384} \quad \text{Eq. (1)}$$

Figure 3:
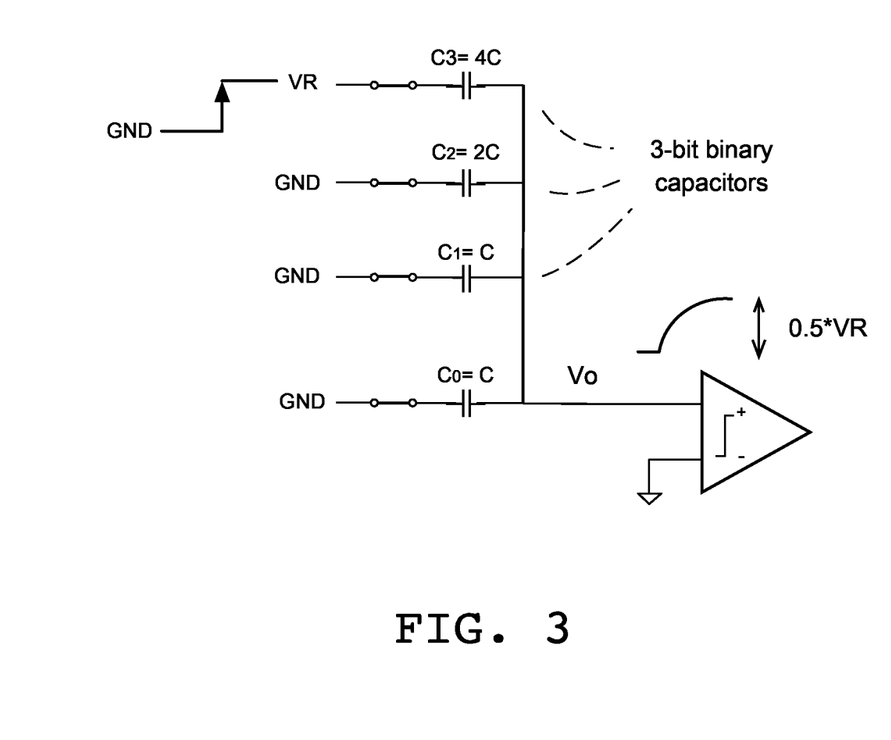
FIG. 3 illustrates the voltage increment of simplified 3-bit binary capacitive DAC.

$V_{IN}$ is the ADC input voltage
B[13:0] is ADC digital outputs
VR is ADC reference voltage FIG. 3 illustrates the voltage increment of exemplary 3-bit binary capacitive DAC. When C3 with value of 4 C is charged from ground to VR, the VR voltage change on C3 is re-distributed to C0, C1 and C2. The voltage change on comparator input Vo is expressed as:

$$V_o = VR * \frac{C3}{C0 + C1 + C2 + C3} = VR * \frac{4C}{C + C + 2C + 4C} = 0.5VR \quad \text{Eq. (2)}$$

The reference voltage of SARADC takes significant power consumption and requires substantial time to settle due to time constant RC. This invention presents a method of eliminating reference voltage of SAR Analog-to-Digital converter, which results in reduced power consumption, compact and enhanced conversion rate.

SUMMARY

A reference-free N-bit SAR Analog-to-Digital (ADC) converter includes input sampling switches and (N−1) bit capacitive DAC; and a comparator and binary search logic; the comparator output couples to binary search logic; the binary search logic couples to (N−1) bit capacitive DAC.

Implementations of the above aspect may include one or more of the following. Each conversion begins with input sampling phase and is followed by binary search phase. The input voltage is captured onto the sampling capacitors during input sampling phase; (N−1) bit capacitive DAC switches are sequentially coupled to comparator input through switches based on comparator output result during binary search phase. The (N−1) bit capacitive DAC couples to comparator input through individual switches and the other end of capacitors are connected together and coupled to supply voltage; the capacitors are pre-charged to supply voltage during input sampling phase. The (N−1) bit capacitors switches couple to comparator input sequentially during binary search phase. The charge of pre-charged capacitor is re-distributed to the sampling capacitor which results in a voltage increment on the comparator input. The increased voltage of the comparator input owing to charge re-distribution is expressed as:

$$\Delta V = \frac{VIN * Cs - VDD * Cn}{Cs - Cn}$$

wherein Cs is the sampling capacitor; Cn is (N−1) bit capacitor; $V_{IN}$ is sampled input voltage. The (N−1) bit capacitive DAC couples to comparator input through individual switches and the other end of capacitors are connected together and coupled to ground; the capacitors are reset to ground during input sampling phase. The (N−1) bit capacitive DAC are reset to ground during input sampling phase; then the sampled input voltage is re-distributed to DAC capacitors through coupled switches during binary search phase. The decreased voltage of comparator input due to charge re-distribution is expressed as:

$$\Delta V = \frac{VIN * Cs}{Cs + Cn}$$

wherein Cs is the sampling capacitor; Cn is (N−1) bit capacitor; $V_{IN}$ is sampled input voltage. The reference eliminated SAR ADC input full scale value is determined by the combination associated to the sampling capacitor and (N−1) bit capacitor value. The reference voltage of SAR ADC is eliminated to enhance conversion rate, achieve compact size and reduce power consumption; the charge re-distribution of binary search is through capacitor switches either coupling to supply voltage or ground.

In another aspect, a method of enhancing SAR ADC conversion rate, includes input switches, capacitive DAC, comparator and binary search logic; the comparator output couples to binary search logic; the binary search logic couples to capacitive DAC.

Implementations of the above aspect may include one or more of the following. Each conversion begins with input sampling phase and is followed by binary search phase. The input voltage is captured onto the sampling capacitors during input sampling phase; (N−1) bit capacitive DAC switches are sequentially coupled to comparator input through switches based on comparator output result during binary search phase. The (N−1) bit capacitive DAC couples to comparator input through individual switches and the other end of capacitors are connected together and coupled to supply voltage; the capacitors are pre-charged to supply voltage during input sampling phase. The (N−1) bit capacitors switches couple to comparator input sequentially during binary search phase. The charge of pre-charged capacitor is re-distributed to the sampling capacitor which results in a voltage increment on the comparator input. The increased voltage of the comparator input owing to charge re-distribution is expressed as:

$$\Delta V = \frac{VIN * Cs - VDD * Cn}{Cs - Cn}$$

wherein Cs is the sampling capacitor; Cn is (N−1) bit capacitor; $V_{IN}$ is sampled input voltage. The (N−1) bit capacitive DAC couples to comparator input through individual switches and the other end of capacitors are connected together and coupled to ground; the capacitors are reset to ground during input sampling phase. The capacitive DAC can be connected to comparator input through individual switches and the other end of capacitors are connected together and coupled to ground; the capacitors are reset to ground during input sampling phase. The capacitive DAC is reset to ground during input sampling phase; then the sampled input voltage is re-distributed to capacitive DAC through switches during binary search phase. The decreased voltage of comparator input due to charge re-distribution is expressed as:

$$\Delta V = \frac{VIN * Cs}{Cs + Cn}$$

wherein Cs is the sampling capacitor; Cn is (N−1) bit capacitor; $V_{IN}$ is sampled input voltage. The reference eliminated SAR ADC input full scale value is determined by the combination associated to the sampling capacitor and capacitor DAC value.

Advantages of the system may include one or more of the following. The reference voltage of SAR ADC is eliminated to enhance conversion rate, achieve compact size and reduce power consumption; the charge re-distribution of binary search is through capacitor switches either coupling to supply voltage or ground. The system eliminates reference voltage of Analog-to-Digital Converter to enhance faster conversion rate, achieve compact size and decrease power consumption for Successive Approximation Register (SAR) Analog-to-Digital Converter (ADC). The presented reference-free SAR Analog-to-Digital Converter charge or discharge the sampled input voltage through capacitive DAC switches during binary search operation. The comparator output and binary search logic determines capacitive DAC switches couple to either supply voltage or ground for charge or discharge path. This method achieves faster conversion rate, simplified circuitry, compact size and low power consumption for SAR ADC.

DETAILED DESCRIPTION

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

The terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Furthermore, it is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Similarly, it is to be noticed that the term "coupled" discloses both direct and indirect coupling and should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

Figure 4:
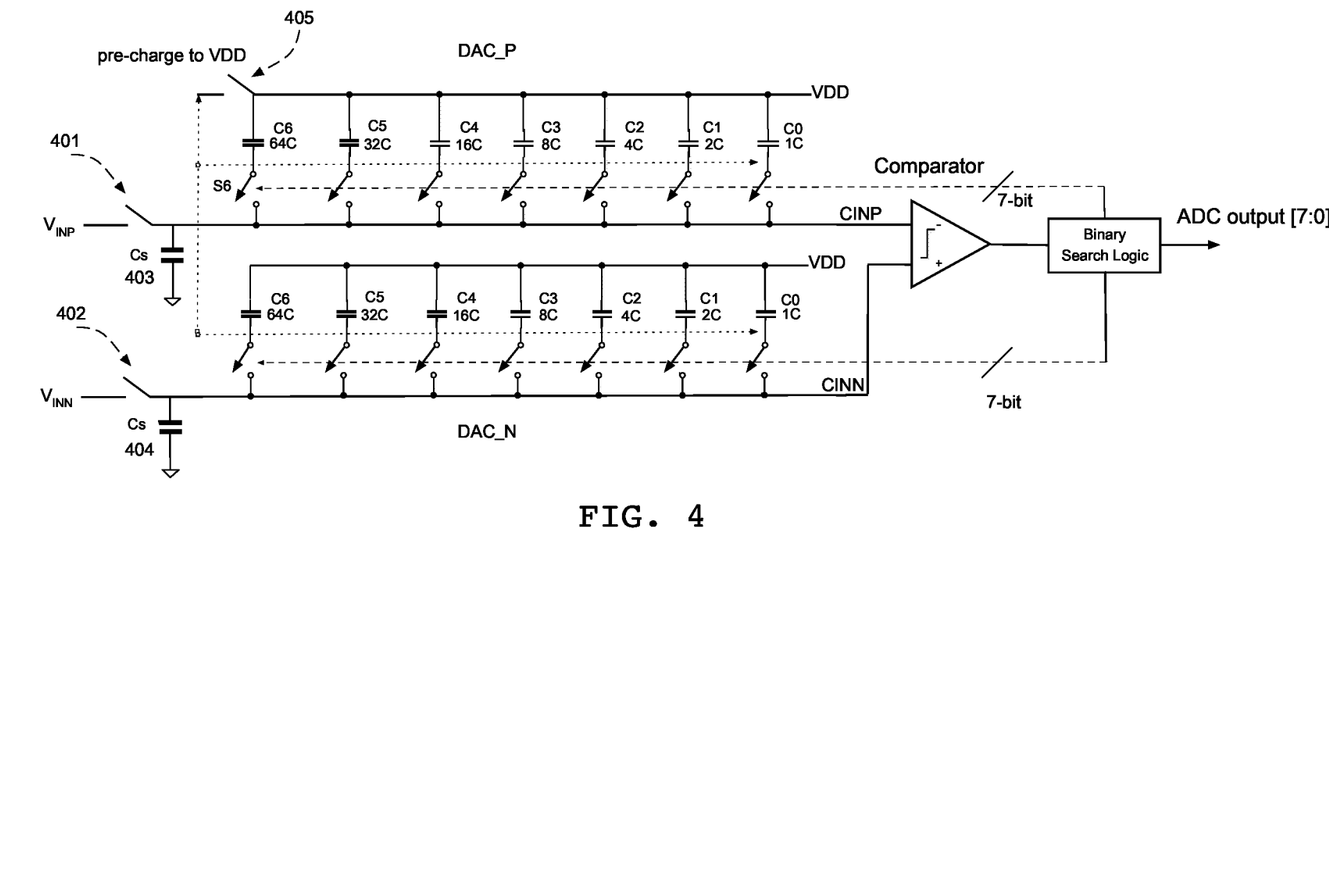
FIG. 4 illustrates the block diagram of reference-free 8-bit SAR ADC.

FIG. 4 illustrates the block diagram of reference-free 8-bit SAR ADC. Differential inputs Vinp/Vinn are sampled onto the sampling capacitor 403 and 404 through switches 401 and 402. DAC_P and DAC_N represent two binary capacitive DAC with capacitor value from 64 C to 1 C. All the capacitors are pre-charged to supply voltage VDD through switch 405. Each capacitor couples to comparator input CINP/CINN through separate switch and the other end of capacitors are all connected to supply voltage VDD. Comparator output is fed into binary search logic and the binary search logic generates 7-bit outputs to control DAC switches.

Note that the inputs VINP/VINN and comparator input are at the same side of capacitors, whereas the input Vin and comparator input are at different sides of the capacitor for the conventional SAR on FIG. 2. For 8-bit SAR conversion, the reference-free method only requires 7 capacitors while conventional SAR requires 8 capacitors for each capacitor DAC.

Each analog-to-digital conversion consists of two phases: (1) input sampling phase and (2) binary search phase. During input sampling phase, switches 401 and 402 are closed and input voltage VINP/VINN are captured onto capacitor 403 and 404. All DAC_P/DAC_N capacitors are pre-charged to supply voltage VDD during input sampling phase through switch 405.

Figure 5:
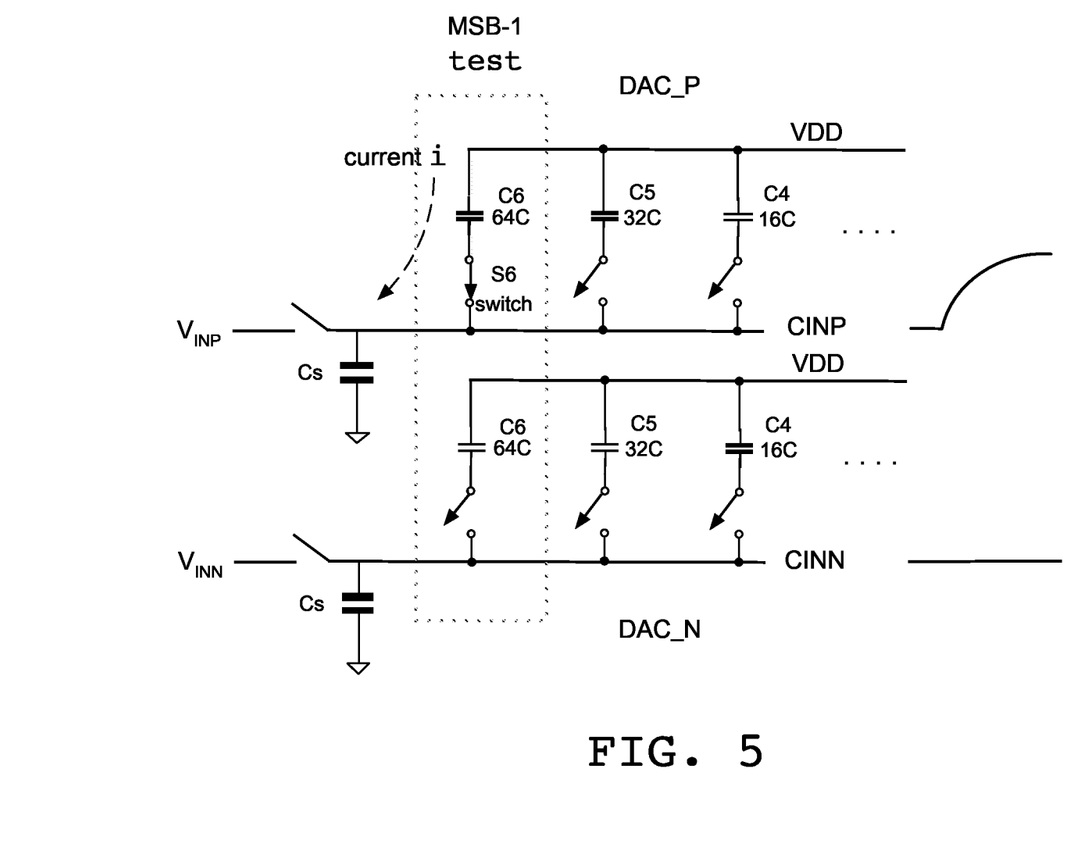
FIG. 5 illustrates the DAC switch operation during binary search MSB-1 test.

When binary search phase begins, comparator first compares the sampled voltage CINP against CINN, this first comparator output is practically ADC MSB output. Then binary search procedure continues on MSB-1 test. If the comparator output of MSB test is negative meaning CINN is greater than CINP, DAC_P C6 switch S6 is closed and coupled to CINP. The charge of C6 is re-distributed to the sampling capacitor Cs through S6 switch and the voltage on CINP is incremented as illustrated on FIG. 5. A current i flows from C6 to the sampling capacitor Cs during this charge transfer. The voltage increment of CINP is expressed as the following equation Eg(3):

$$\Delta V(CINP) = \frac{V_{INP} * Cs - VDD * C6}{Cs - C6}$$

Figure 6:
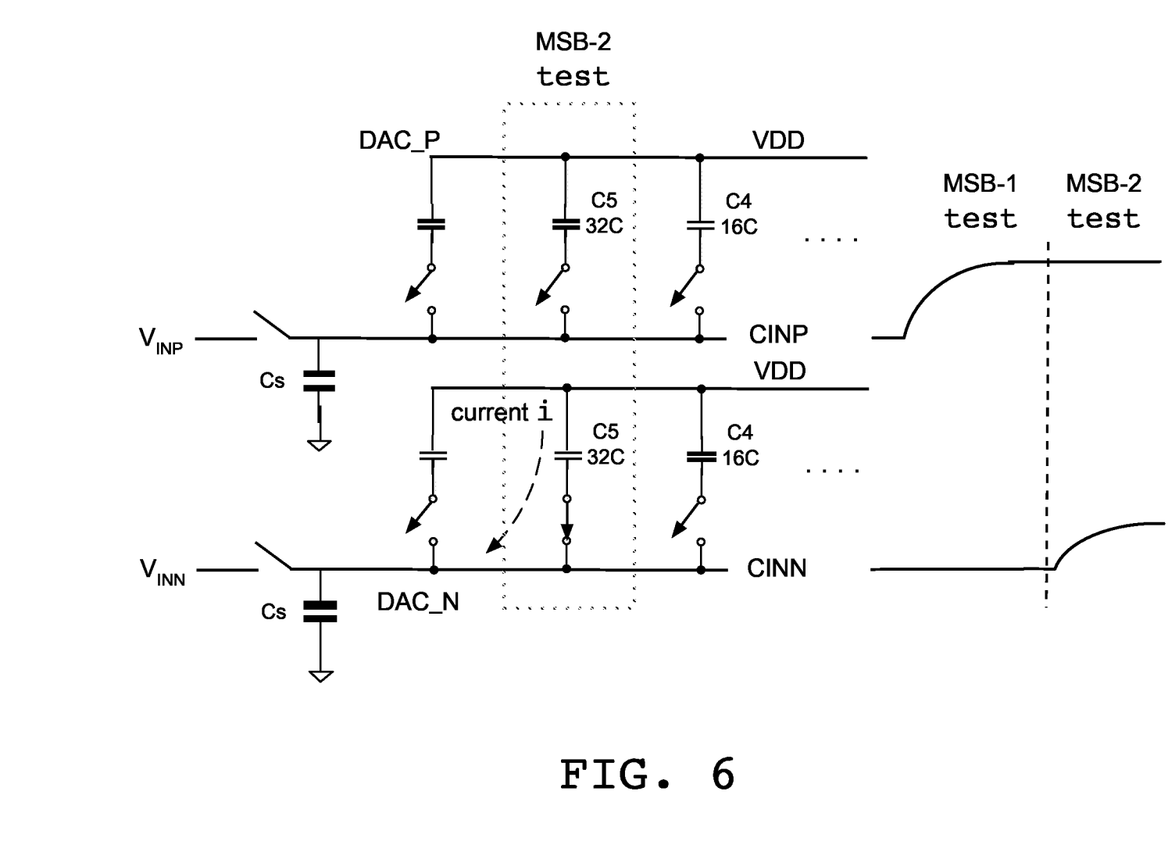
FIG. 6 illustrates the DAC switch operation during binary search MSB-2 test.

$V_{INP}$ is the ADC input voltage
VDD is supply voltage
Cs is the sampling capacitor value
C6 is bit-6 capacitor DAC value Once the charge re-distribution and transfer is complete, comparator strobes again and binary search proceeds to MSB-2 test. If the comparator output is positive meaning CINP voltage is greater than CINN voltage, DAC_N capacitor C5 switch is closed and coupled to CINN as illustrated on FIG. 6. Pre-charged C5 voltage is discharged to the sampling capacitor Cs through switch and CINN voltage is increased. The incremented CINN voltage is expressed as equation Eq(4):

$$\Delta V(CINN) = \frac{V_{INN} * Cs - VDD * C5}{Cs - C5}$$

The binary search algorithm continues other capacitors C4~C0 sequentially until the least significant bit (LSB) test is complete. ADC full scale voltage is determined by the combination associated to the sampling capacitor value and DAC capacitor values.

Figure 7:
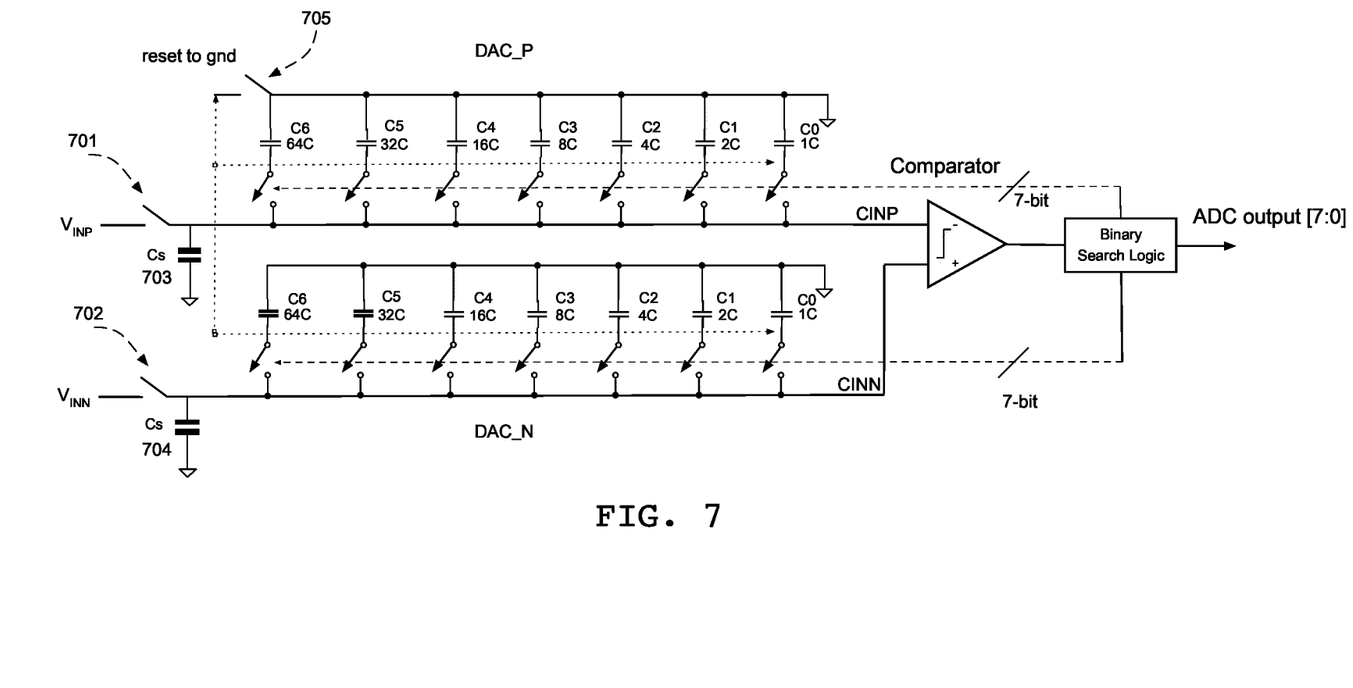
FIG. 7 illustrates ground reset implementation of reference-free 8-bit SAR ADC.
Figure 8:
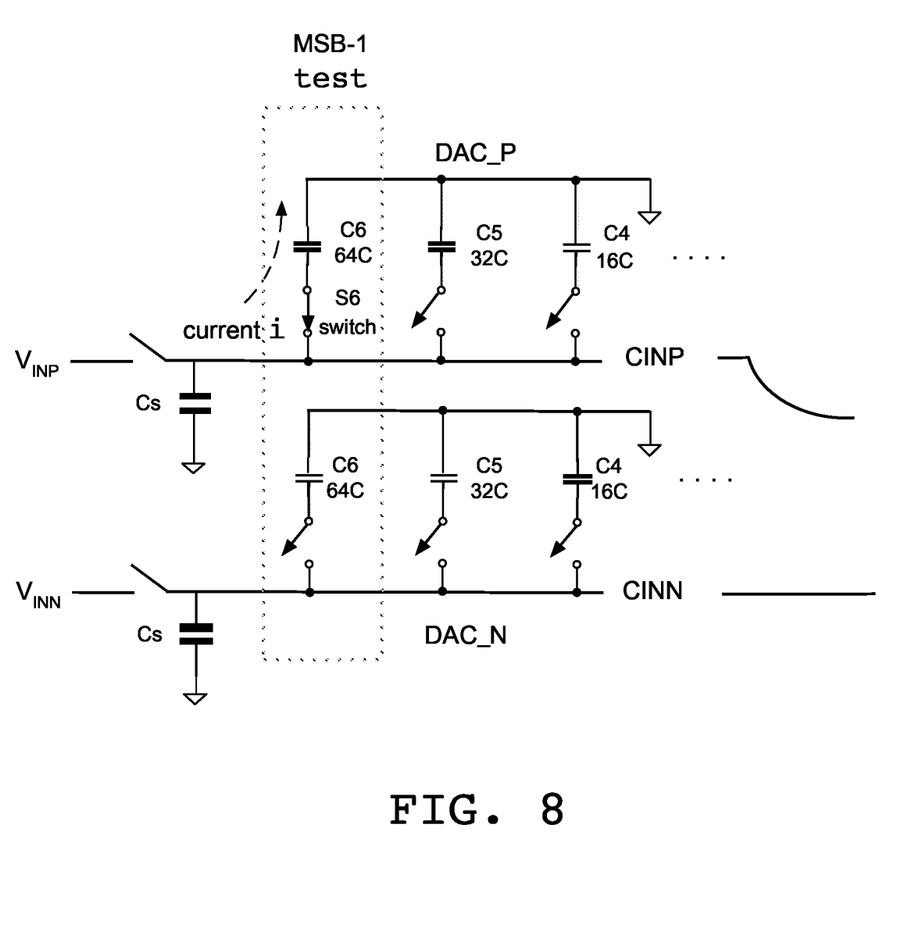
FIG. 8 illustrates the DAC switch operation during binary search MSB-1 test.

FIG. 7 illustrates another implementation of reference-free 8-bit SAR ADC, wherein the capacitors are reset to ground instead of supply VDD during input sampling phase. The conversion begins with input captured onto the sampling capacitor 703, 704 through switches 701, 702 during input sampling phase. All the capacitors are reset to ground through switch 705. Then capacitors switches sequentially couple to comparator inputs based on the comparator output value during binary search phase. The binary search phase starts with MSB-1 capacitor C6 and proceeds to other capacitors until LSB capacitor C0 is exercised. FIG. 8 illustrates the switch and capacitor discharge during MSB-1 test. When comparator output is positive meaning CINP voltage is greater than CINN voltage, C6 switch S6 is coupled to CINP, this results in the discharge of CINP voltage to ground through switch S6. There is current i flowing from CINP node to ground through switch S6. The decreased voltage is expressed as the following equation:

$$V(CINP) = \frac{VINP * Cs}{Cs + C6}$$

Figure 9:
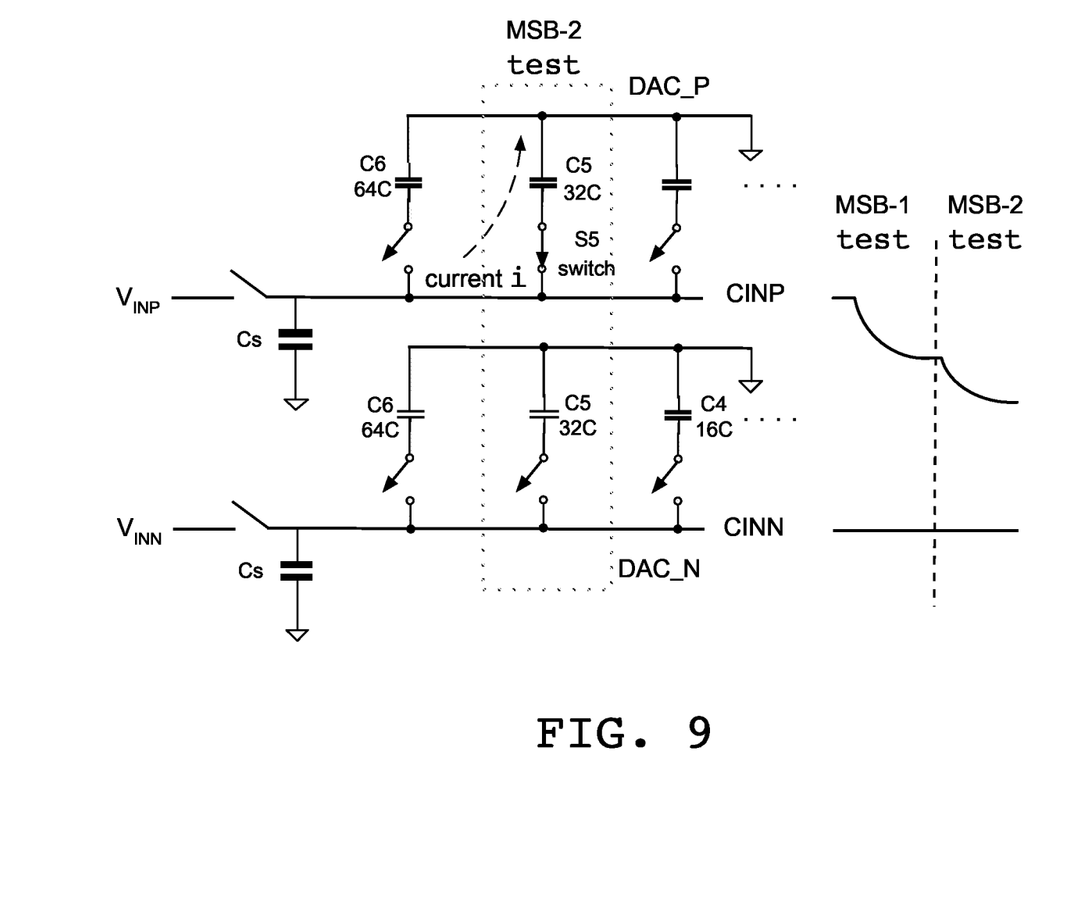
FIG. 9 illustrates the DAC switch operation during binary search MSB-2 test.

FIG. 9 illustrates the switch and capacitor discharge during MSB-2 test after MSB-1 test of FIG. 8. The comparator output is positive meaning CINP voltage is greater than CINN voltage, this results in C5 switch S5 couples to CINP controlled by binary search logic. A current i flows from CINP to ground through switch S5 and this decreases CINP voltage. The binary search process continues until the LSB capacitor C0 is exercised to complete one conversion.

The advantages of reference eliminated SAR ADC includes faster conversion rate, simplified circuitry, compact size and low power consumption. The ADC full scale voltage is determined by the combination associated to the sampling capacitor and capacitor DAC value.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above. The connections as discussed herein may be any type of connection suitable to transfer signals from or to the respective nodes, units or integrated circuit devices.

Accordingly, unless implied or stated otherwise, the connections may for example be direct connections or indirect connections. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the architectures depicted herein are merely exemplary, and that in fact many other architectures can be implemented which achieve the same functionality. Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the circuit and/or component examples may be implemented as any number of separate integrated circuits or separate devices interconnected with each other in a suitable manner. The specifications and drawings are, accordingly, to be regarded in an illustrative rather than in a restrictive sense. In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one, or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

A more complete appreciation of the present invention and its improvements can be obtained by reference to the accompanying drawings, which are briefly summarized below, to the following detailed description of illustrative embodiments of the invention, and to the appended claims.

What is claimed is:

1. A reference-free N-bit Successive Approximation Register (SAR) Analog-to-Digital (ADC) converter, comprising:
    input sampling switches and (N−1) bit capacitive DAC; and
    a comparator and binary search logic; the comparator output is coupled to the binary search logic, and the binary search logic is further coupled to the (N−1) bit capacitive DAC and wherein a SAR ADC input full scale value is determined by a combination associated with a sampling capacitor and an (N−1) bit capacitor value without a reference, wherein the (N−1) bit capacitive DAC couples to comparator input through individual switches and the other end of capacitors are connected together and coupled to ground;
    wherein the capacitors are reset to ground during an input sampling phase.

2. The converter of claim 1, wherein each conversion begins with input sampling phase and is followed by binary search phase, wherein the input voltage is captured onto the sampling capacitors during input sampling phase, and wherein (N−1) bit capacitive DAC switches are sequentially coupled to comparator input through switches based on comparator output result during binary search phase.

3. The converter of claim 1, wherein the (N−1) bit capacitive DAC couples to comparator input through individual switches and the other end of capacitors are connected together and coupled to a supply voltage, wherein the capacitors are pre-charged to supply voltage during an input sampling phase.

4. The converter of claim 1, comprising (N−1) bit capacitors switches coupled to a comparator input sequentially during a binary search phase, wherein a charge of a pre-charged capacitor is re-distributed to a sampling capacitor which results in a voltage increment on the comparator input.

5. The converter of claim 4, wherein the increased voltage of the comparator input due to charge re-distribution is expressed as:

$$\Delta V = \frac{VIN * Cs - VDD * Cn}{Cs - Cn}$$

wherein Cs is the sampling capacitor; Cn is (N−1) bit capacitor; VIN is sampled input voltage.

6. The converter of claim 1, (N−1) bit capacitive DAC are reset to ground during input sampling phase; then the sampled input voltage is re-distributed to DAC capacitors through coupled switches during binary search phase, wherein a decreased voltage of comparator input due to charge re-distribution is expressed as:

$$\Delta V = \frac{VIN * Cs}{Cs + Cn}$$

wherein Cs is the sampling capacitor; Cn is (N−1) bit capacitor; VIN is sampled input voltage.

7. A reference-free N-bit Successive Approximation Register (SAR) Analog-to-Digital (ADC) converter, comprising:
    input sampling switches and (N−1) bit capacitive DAC; and
    a comparator and binary search logic; the comparator output is coupled to the binary search logic, and the binary search logic is further coupled to the (N−1) bit capacitive DAC, wherein a reference voltage of SAR ADC is eliminated to enhance conversion rate, achieve compact size and reduce power consumption; and wherein a charge re-distribution of binary search is through capacitor switches either coupling to supply voltage or ground.

8. A method of enhancing a Successive Approximation Register (SAR) Analog-to-Digital (ADC) conversion rate, wherein the ADC comprises input switches, a capacitive Digital-to-Analog (DAC), a comparator and a binary search logic; the comparator output coupled to the binary search logic and the binary search logic coupled to capacitive DAC, the method comprising determining a SAR ADC input full scale value by a combination associated with a sampling capacitor and an (N−1) bit capacitor value without a reference.

9. The method of claim 8, comprising beginning each conversion with an input sampling phase and then performing a binary search phase, wherein an input voltage is captured onto the sampling capacitors during input sampling phase; capacitive DAC switches are coupled sequentially to comparator input through switches based on comparator output result during binary search phase.

10. The method of claim 8, wherein capacitive DAC couples to comparator input through individual switches and the other end of capacitors are connected together and coupled to a supply voltage; comprising pre-charging the capacitors with a supply voltage during the input sampling phase.

11. The method of claim 8, wherein capacitors switches couple to comparator input sequentially during binary search phase, comprising re-distributing the charge of pre-charged capacitor to the sampling capacitor which results in a voltage increase on the comparator input.

12. The method of claim 11, wherein the increased voltage of the comparator input owing to charge re-distribution is expressed as:

$$\Delta V = \frac{VIN * Cs - VDD * Cn}{Cs - Cn}$$

wherein Cs is the sampling capacitor; Cn is (N−1) bit capacitor; VIN is sampled input voltage.

13. The method of claim 8, wherein capacitive DAC couples to comparator input through individual switches and the other end of capacitors are connected together and coupled to ground, comprising resetting the capacitors to ground during the input sampling phase.

14. The method of claim 8, comprising resetting the capacitive DAC to ground during the input sampling phase; and redistributing the sampled input voltage to the capacitive DAC through switches during the binary search phase, wherein the decreased voltage of comparator input due to charge re-distribution is expressed as:

$$\Delta V = \frac{VIN * Cs}{Cs + Cn}$$

wherein Cs is the sampling capacitor; Cn is (N−1) bit capacitor; VIN is sampled input voltage.

15. The method of claim 8, wherein the reference eliminated SAR ADC input full scale value is determined by the combination associated to the sampling capacitor and capacitor DAC value.

16. The method of claim 8, wherein the reference voltage of SAR ADC is eliminated to enhance conversion rate, achieve compact size and reduce power consumption; the charge re-distribution of binary search is through capacitor switches either coupling to supply voltage or ground.

* * * * *